Figure 1:
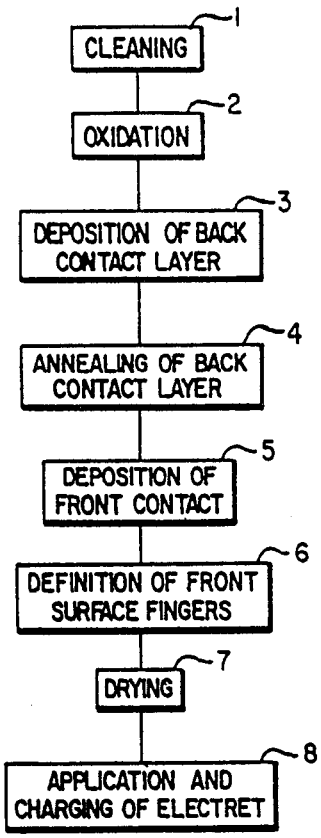

United States Patent [19]

Perlman et al.

[11] 4,435,610
[45] Mar. 6, 1984

[54] ELECTRET SEMICONDUCTOR SOLAR CELL

[75] Inventors: Martin M. Perlman, Montreal; Andre Y. Filion, Greenfield Park, both of Canada

[73] Assignee: Her Majesty the Queen in right of Canada, as represented by the Minister of National Defence, Ottawa, Canada

[21] Appl. No.: 458,019

[22] Filed: Jan. 14, 1983

[30] Foreign Application Priority Data

Sep. 7, 1982 [CA] Canada .................................. 410894

[51] Int. Cl.³ ...................... H01L 31/06; H01L 31/18
[52] U.S. Cl. ...................................... 136/255; 29/572; 357/6; 357/15; 357/30; 427/74; 136/263
[58] Field of Search ................... 136/255, 263; 357/30, 357/6, 15; 29/572; 427/74

[56] References Cited

PUBLICATIONS

A. Filion et al., "Electret-Semiconductor Solar Cell", Conf. Record, 16th IEEE Photovoltare Specialists Conf. (1982), pp. 973-977, published Jan. 1983.

Primary Examiner—Aaron Weisstuch
Attorney, Agent, or Firm—Cushman, Darby & Cushman

[57] ABSTRACT

An induced junction solar cell includes a silicon semiconductor wafer with an aluminum ohmic contact layer on one surface, a thin oxide layer on the other surface, a grid-type aluminum contact on the oxide layer and an electret, i.e. charged outer polymer layer covering the grid-type contact and exposed oxide layer. The electric field of trapped charges in the electret penetrate the semiconductor and separate photogenerated carriers. Minority carriers are extracted through a rectifying grid-type contact to permit a build-up of potential and a barrier for majority carriers.

8 Claims, 2 Drawing Figures

ELECTRET SEMICONDUCTOR SOLAR CELL

This invention relates to a solar cell and in particular to an induced junction solar cell.

Solar cells have been the subject of a considerable amount of research during the past decade. Such cells could constitute an important renewable energy resource without major ecological drawbacks. One form of cell is a silicon, single crystal junction cell, which was developed for space projects, and which is too expensive for widespread use as an energy source. The present high temperature process used in diffused junction formation cannot be used in polycrystalline silicon. Such high temperatures would cause dopants to diffuse along grain boundaries, and would lead to a reduction in minority carrier properties. These effects would keep the achievable energy conversion efficiency low.

It is possible to circumvent the high temperature diffusion step by maring an interface or surface solar cell. One example, is the Schottky barrier solar cell or the improved version thereof, namely the metal-insulator-semiconductor (MIS) cell. The incorporation of an insulator between the metal and the semiconductor reduces the majority carrier current flow across the barrier, and thus improves this type of cell. However, Schottky cells are not of great interest because the fraction of light absorbed in the metal film limits efficiency.

Recently, an improved MIS cell has been made by replacing the continuous semitransparent metal film on the front surface by metal fingers spaced short distances apart and covering approximately 8% of the front surface. This type of cell works with a p-type silicon substrate, because residual positive charge in the oxide layer contributes to a surface depletion layer and thus to the separation of photocarriers. The performance of such cells is further improved when anti-reflection coating materials are evaporated over the grid and oxide. The resulting devices are known as induced junction solar cells with MIS front contact.

In spite of the considerable amount of research in the area, there still exists a need for a relatively efficient, stable solar cell. The object of this invention is to provide such a cell.

Accordingly, the present invention relates to an induced junction solar cell comprising a p-type semiconductor substrate; a thin oxide layer on front surface of said substrate; a grid-type rectifying contact on said oxide layer; a charged polymer coating on said front surface and rectifying contact; and an ohmic contact layer on the other surface of said substrate.

The invention also relates to a process for producing a solar cell comprising the steps of cleaning a p-type semiconductor substrate; oxidizing said substrate; forming a grid-type rectifying contact on one surface of substrate; depositing a charged polymer coating on said grid-type contact; and forming an ohmic contact layer on the other surface of said substrate.

Figure 2:
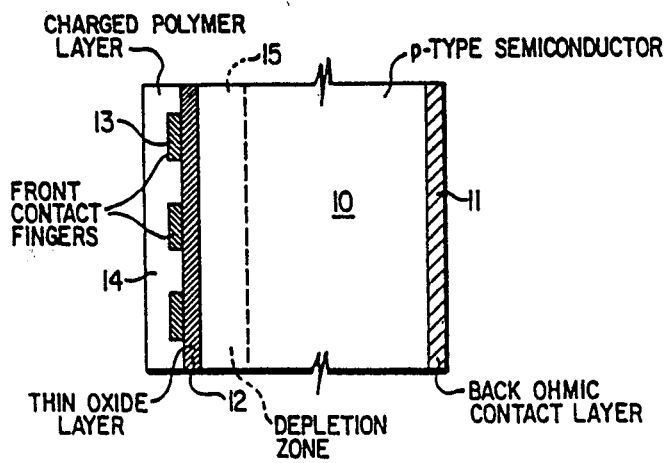

The invention will now be described in greater detail with reference to the accompanying drawing, which illustrates a preferred embodiment of the invention, and wherein:

FIG. 1 is a block flow diagram of the process for producing a solar cell in accordance with the present invention; and FIG. 2 is a schematic cross-section view of a portion of a solar cell in accordance with the present invention.

PROCESS

A solar cell in accordance with the present invention is produced using a semiconductor substrate, in this case a p-type silicon wafer having a resistivity of approximately 1 ohm-cm and oriented in the <100> direction. In order to establish good contacts to the wafer, the surfaces thereof must be clear. When the substrate is not properly cleaned, metal films deposited thereon by vacuum show poor adherence and a high contact resistance. Impurities on the surface of the substrate also affect the I-V characteristic of the MIS diodes, giving an erratic and irreproducible behavior often accompanied by rapid degradation. The cleaning procedure is the so-called "RCA clean", involving three basic steps, namely the removal of thin layers of organic contaminents, stripping of any native oxide and the removal of heavy metals.

In the following description of the cleaning procedure (step 1 in FIG. 1), all parts are by volume. In the first step of the cleaning, the silicon is immersed for 10 minutes in a solution of 1 part 30% $NH_4OH$, 1 part 30% $H_2O_2$ and 5 parts deionized water at a temperature of $(80\pm5)°$ C. The solution should be prepared immediately before use, because $H_2O_2$ decomposes rapidly under these conditions. The temperature of the solution should not exceed 85° C. If the $H_2O_2$ concentration falls too low, or the temperature rises too high, the silicon may be pitted. The silicon is then rinsed for at least 10 minutes in a deionized water cascade, immersed for 1 minute in a solution of 1 part 40% HF to 9 parts deionized water at room temperature, and again rinsed for at least 10 minutes in a deionized water cascade. The thus cleaned silicon is immersed for 10 minutes in a solution of 1 part 36% HCl, 1 part 30% $H_2O_2$ and 6 parts deionized water at a temperature of $(80\pm5)°$ C., rinsed for at least 10 minutes in a deionized water cascade and dried by blowing with a jet of oil-free nitrogen.

The second step (2 in FIG. 1) in the process of the present invention is oxidation. Although a very thin layer of oxide grows at the silicon surface during the last step of the cleaning procedure, further oxidation at a temperature greater than 400° C. is required to produce minority carrier metal insulator semiconductor (MIS) diodes. Accordingly, the wafer is placed in a quartz tube furnace at a temperature of 520° C. and medical grade oxygen is caused to flow therethrough at a rate of 12 liters per minute. The procedure results in an oxide layer having a thickness of approximately 20Å.

In step 3 of the process, the back contact is deposited on the back surface oxide layer of the wafer. Aluminum is thermally evaporated on the back surface of the wafer, the starting residual pressure being approximately $2\times10^{-6}$ torr. The final thickness of such contact is 1 μm. The back surface is annealed in step 4 of the process, so that the metal penetrates the oxide to contact the silicon. By heating the wafer at 500° C. for 20 minutes in a nitrogen atmosphere, an ohmic back contact is formed. Preferably, clean nitrogen containing less than 25 ppm oxygen or water vapor is used.

In a similar manner, an aluminum contact is deposited on the front surface in step 5 of the process. A lower evaporation rate is used to give better conductivity. The front contact is 1 μm. In order to collect carriers in the front surface grid, it is necessary to provide closely spaced fingers, i.e. the front contact must be defined by a grid structure (step 6). The distance between adjacent fingers must be smaller than the diffusion length of the carriers in the two dimensional surface channel. A spacing of approximately 200 μm is adequate. The total coverage of the front surface must be low to avoid absorbing too much light, but the series resistance of the fingers is inversely proportional to their width. A compromise is obtained by using a coverage of approximately 8%. In the present case, the mask includes 20 μm wide fingers which are spaced apart by 200 μm. The mask is first made on a large sheet of rubylith and is then reduced optically. Immediately after evaporating the front contact, a positive photoresist is aplied over the metal film using a spinner. The resist is baked and exposed to ultraviolet light through the mask. After developing, cleaning and drying, the exposed metal film is etched with acid. The remaining polymerized photoresist is removed, and the wafer is cleaned. The wafer is placed in an oven at 250° C. for 20 minutes in the presence of nitrogen to remove all traces of water or any other volatile substance remaining on the wafer.

Step 7, which is the last step in the fabrication of the semiconductor electret solar cell, is the provision of a material which will provide a large electric field on the front surface for inducing a junction in the semiconductor. It is important to prevent the formation of air gaps at the interface between the semiconductor and the electret. This is achieved by casting a polar electret such as polyvinylidene fluoride or a copolymer of vinylidene fluoride and tetrafluoroethylene on the front surface at an elevated temperature, followed by cooling in the presence of an external field. Another possibility is the casting and vacuum deposition of non-polar films, and corona charging of their outer surfaces.

The resulting product (FIG. 2) is an electret-semiconductor solar cell including a p-type semiconductor (silicon) 10, with an ohmic contact layer 11 on one surface thereof. An oxide layer 12 having a thickness of 15 to 20Å is provided on the other surface of the semiconductor 10. A grid-type rectifying contact 13 overlies the oxide layer 12. The exposed oxide layer 12 and the contact 13 are covered by an outer electret layer, i.e. a positively charged polymer layer 14. In such a cell, light is absorbed in the semiconductor 10, generating electron hole pairs. Such photocarriers, diffuse in all directions and, since the diffusion length is greater than the thickness of the semiconductor wafer 10, a considerable fraction of the photocarriers reach a front or outer surface depletion zone 15 (FIG. 2) of the semiconductor 10. In the depletion zone 15, the positive charges of the electrect attract the electrons and repel the holes. The electrons drawn toward the surface are still free to move in the surface channel, and some of the electrons reach the region covered by the front surface contact 13. The contact 13 is designed to behave as a minority carrier nonequilibrium diode, and provides a natural path for the electrons to tunnel into the metal, provided the oxide layer has a thickness less that 50Å.

The embodiments of the invention in which an exclusive property or privilege is claimed are defined as follows:

1. An induced junction solar cell comprising a p-type semiconductor substrate; a thin oxide layer on a front surface of said substrate; a grid-type rectifying contact on said oxide layer; a charged polymer coating on said front surface and rectifying contact; and an ohmic contact layer on the other surface of said substrate.

2. A solar cell according to claim 1, wherein said substrate is silicon.

3. A solar cell according to claim 2, wherein said rectifying contact and said ohmic contact layer are aluminium.

4. A solar cell according to claim 1, wherein said polymer is selected from polyvinylidene fluoride and a copolymer of vinylidene fluoride and tetrafluoroethylene.

5. A process for producing a solar cell comprising the steps of cleaning a p-type semiconductor substrate, oxidizing said substrate; forming a grid-type rectifying contact on one surface of substrate; depositing a charged polymer coating on said grid-type contact; and forming on ohmic contact layer on the other surface of said substrate.

6. A process according to claim 5, wherein said semiconductor substrate is silicon.

7. A process according to claim 6, wherein said rectifying contact and said ohmic contact layer are formed of aluminium.

8. A process according to claim 5, wherein said polymer is selected from polyvinylidene fluoride and a copolymer of vinylidene fluoride and tetrafluoroethylene.

* * * * *